(12) United States Patent
Asai et al.

(10) Patent No.: US 6,217,990 B1
(45) Date of Patent: Apr. 17, 2001

(54) MULTILAYER CIRCUIT BOARD HAVING NO LOCAL WARP ON MOUNTING SURFACE THEREOF

(75) Inventors: Yasutomi Asai, Okazaki; Takashi Nagasaka, Anjo; Shinji Ota, Okazaki; Takashi Yamazaki, Kokubu; Shinya Terao, Aira-gun; Syoichi Nakagawa, Kokubu, all of (JP)

(73) Assignees: Denso Corporation, Kariya (JP); Kyocera Corporation, Kyoto (JP)

( * ) Notice: Subject to any disclaimer, the term of this patent is extended or adjusted under 35 U.S.C. 154(b) by 0 days.

(21) Appl. No.: 09/073,139

(22) Filed: May 6, 1998

(30) Foreign Application Priority Data

May 7, 1997 (JP) .................................... 9-116929

(51) Int. Cl.⁷ .......................... B32B 3/00; H01L 23/485
(52) U.S. Cl. ...................... 428/210; 257/668; 257/700; 257/702; 257/758; 257/774; 257/778; 361/768; 361/751; 361/774; 361/783
(58) Field of Search .................. 429/210; 257/700, 257/701, 702, 668, 758, 774, 778; 428/210; 361/768, 751, 774, 783

(56) References Cited

U.S. PATENT DOCUMENTS

| | | | |
|---|---|---|---|
| 4,618,879 | * 10/1986 | Mitzukoshi et al. | 257/700 |
| 4,761,325 | * 8/1988 | Kurihara et al. | 428/210 |
| 5,290,375 | * 3/1994 | Nagasaka et al. | 156/89 |
| 5,585,675 | * 12/1996 | Knopf | 257/774 |
| 5,627,344 | * 5/1997 | Tanifuji et al. | 174/257 |
| 5,654,590 | * 8/1997 | Kuramochi | 257/778 |
| 5,708,570 | * 1/1998 | Polinski, Sr. | 428/210 |
| 5,731,067 | * 3/1998 | Asai et al. | 428/210 |
| 5,920,126 | * 7/1999 | Sohara | 257/778 |
| 5,928,769 | * 7/1999 | Monma et al. | 428/210 |

FOREIGN PATENT DOCUMENTS

| | | |
|---|---|---|
| 58-048984 | 3/1983 | (JP) . |
| 63-271911 | 11/1988 | (JP) . |
| 2-55267 | 2/1990 | (JP) . |
| 2-141476 | 5/1990 | (JP) . |
| 2-212141 | 8/1990 | (JP) . |
| 2-239648 | 9/1990 | (JP) . |
| 3-178194 | 8/1991 | (JP) . |
| 3-178195 | 8/1991 | (JP) . |
| 4-84494 | 3/1992 | (JP) . |
| 5-29771 | 2/1993 | (JP) . |
| 5-37160 | 2/1993 | (JP) . |
| 5-75263 | 3/1993 | (JP) . |
| 5-82964 | 4/1993 | (JP) . |
| 5-283864 | 10/1993 | (JP) . |
| 6-61648 | 3/1994 | (JP) . |
| 6-252556 | 9/1994 | (JP) . |
| 7-15144 | 1/1995 | (JP) . |
| 7-273456 | 10/1995 | (JP) . |
| 7-283541 | 10/1995 | (JP) . |
| 7-291738 | 11/1995 | (JP) . |
| 7-326835 | 12/1995 | (JP) . |

* cited by examiner

Primary Examiner—Cathy Lam
(74) Attorney, Agent, or Firm—Pillsbury Winthrop LLP

(57) ABSTRACT

A multilayer circuit board for holding a flip chip thereon includes laminated first to fourth substrates. A first pattern integrated portion having a locally high pattern density is provided on the second substrate. Further, on the fourth substrate which is disposed on an opposite side of the second substrate with respect to a center in a laminated direction of the circuit board, a second pattern integrated portion having a locally high pattern density is disposed to correspond to the first pattern integrated portion. Accordingly, a local warp can be prevented from being produced on the mounting surface of the multilayer circuit board when the circuit board is manufactured by baking.

13 Claims, 6 Drawing Sheets

MULTILAYER CIRCUIT BOARD HAVING NO LOCAL WARP ON MOUNTING SURFACE THEREOF

CROSS REFERENCE TO RELATED APPLICATION

This application is based upon and claims the benefit of priority of the prior Japanese Patent Application No. 9-116929 filed on May 7, 1997, the contents of which are incorporated herein by reference.

BACKGROUND OF THE INVENTION

1. Field of the Invention

The present invention relates to a ceramic multilayer circuit board manufactured by baking several laminated green sheets, which respectively have wiring patterns thereon, and particularly relates to a ceramic multilayer circuit board suitable for holding electronic parts on a surface thereof.

2. Related Arts

A ceramic multilayer circuit board is generally manufactured by a green sheet lamination method using laminated green sheets. Specifically, first, via-holes are formed in the respective green sheets in a punching process and are filled with a tungsten paste or a molybdenum paste. Then, conductive layers are formed on the respective green sheets to form wiring patterns (inside wiring patterns) in a printing process using a paste such as a tungsten paste or a molybdenum paste as well. After performing the above-mentioned processes, a specific number of the green sheets are laminated and are hot-pressed to be united to each other. The united green sheets are cut into a specific shape, and then are baked at a specific temperature. Accordingly, the ceramic multilayer circuit board with a basic structure is obtained.

To mount an electronic parts such as a flip chip on the multilayer circuit board, a solder paste is previously applied to a mounting surface of the circuit board by a screen printing method using a print mask. In this case, however, it is difficult to apply the solder paste to a specific portion of the mounting surface with a uniform thickness. There is a case that the specific portion of the mounting surface has a part to which the solder paste is not applied. This results in deterioration of mounting reliability of the electronic part.

One of reasons why the solder paste cannot, be uniformly applied to the specific portion of the mounting surface is a warp locally generated on the circuit board, especially to raise a part of the mounting surface. The warp of the circuit board locally raising the mounting surface increases a pressure applied thereto by a squeegee in the printing process. As a result, the non-applied portion of the solder paste is produced. The warp further adversely affects the print mask to reduce a duration of life of the print mask.

On the other hand, in recent years, a flip chip having a plurality of bump electrodes is mounted on the circuit board to realize a high mounting density, so that the number of the bump electrodes on the circuit board is increased. To comply with the increase in number of the bump electrodes, each diameter and a bump pitch of the bump electrodes are decreased. This results in a decrease in a gap between the flip chip and the mounting surface of the circuit board. If the circuit board has the warp locally raising the mounting surface where the flip chip is mounted, the gap between the flip chip and the mounting surface of the circuit board is further decreased.

The gap between the flip chip and the circuit board is generally filled with a resin material containing inorganic filler such that the bump electrodes is not affected by thermal stress caused by a difference in thermal coefficient between the flip chip and the circuit board. When the resin material is supplied into the gap between the flip chip and the circuit board having the above-mentioned local warp, the warp prevents the inorganic filler from being uniformly distributed in the gap. As a result, the mounting reliability of the flip chip deteriorates.

SUMMARY OF THE INVENTION

The present invention has been made in view of the above-mentioned problems and an object of the present invention is to provide a multilayer circuit board with a simple structure capable of preventing a local warp of a mounting surface thereof. Another object of the present invention is to provide a multilayer circuit board capable of providing mounting reliability of an element which is mounted on the circuit board.

According to the present invention, a multilayer circuit board includes first laminated substrates and second laminated substrates laminated with the first laminated substrates. A first conductive pattern is disposed on a first surface of one of the first laminated substrates, while a second conductive pattern is disposed on a second surface of one of the second laminated substrates. The first and second conductive patterns respectively have pattern densities which are locally high on first and second pattern integrated portions corresponding to each other. Preferably, the first and second surfaces are symmetrical with respect to a center in a laminated direction of the laminated substrates.

The multilayer circuit board is formed by baking laminated green sheets to which conductive paste for the first and second conductive patterns is applied. According to the present invention, when the laminated sheets are baked, shrinkage forces of the conductive paste and the green sheets lie on the first and second pattern integrated portions can be canceled. As a result, the multilayer circuit board is formed without having a local warp on a mounting surface thereof.

To achieve the above-mentioned object, a multilayer circuit board composed of laminated substrates can have lead wiring members disposed on a surface of one of the laminated substrates, which is the most adjacent to a center in a laminated direction of the laminated substrates. The multilayer circuit board holds thereon an electronic part having electrodes, and the lead wiring members are electrically connected with the electrodes of the electronic part. Otherwise, a multilayer circuit board composed of laminated substrates can have lead wiring members disposed on two surfaces of the laminated substrates. The lead wiring members are electrically connected with electrodes of an electronic part mounted on the multilayer circuit board. Preferably, the two surfaces on which the lead wiring members are disposed are symmetrical with respect to a center in a laminated direction of the laminated substrates. In either case, the multilayer circuit board can be formed without having a local warp on a mounting surface thereof.

BRIEF DESCRIPTION OF THE DRAWINGS

These and other objects and features of the present invention will become more readily apparent from a better understanding of preferred embodiments described below with reference to the following drawings.

DETAILED DESCRIPTION OF THE PREFERRED EMBODIMENTS

The inventors of the present invention found an occurrence mechanism of a local warp of a multilayer circuit board based on various experiments and analyses. The mechanism will be explained with reference to FIGS. 1A, 1B, 1C, and 2.

Figure 1A:
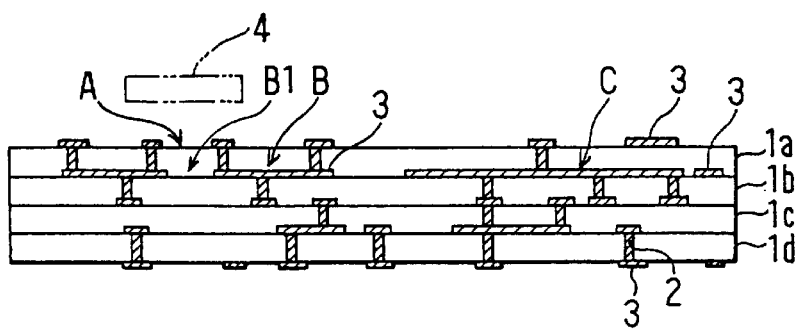
FIGS. 1A to 1C are cross-sectional views for explaining an occurrence mechanism of a local warp of a multilayer circuit board.
Figure 1B:
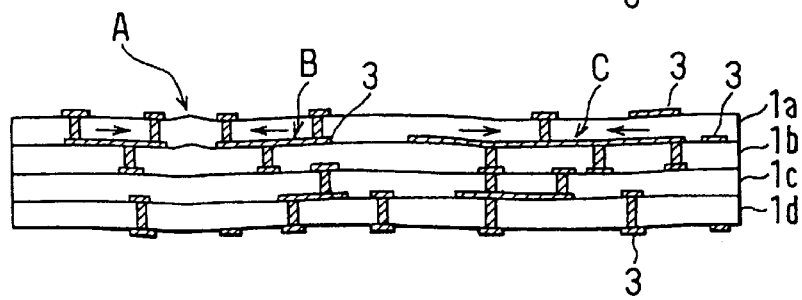

FIG. 1A shows laminated green sheets 1a to 1d before baked. The green sheets 1a to 1d are made of alumina of 92%. Each of the green sheets 1a to 1d has a plurality of via-holes 2 therein and a printed tungsten paste 3 thereon for forming a conductive pattern. The laminated green sheets 1a to 1d are united to each other by hot pressing. The uppermost green sheet 1a has a chip mounting surface A thereon. In FIG. 1A, reference numeral 4 indicates a flip chip which is to be mounted on the chip mounting surface A. The second green sheet 1b has lead wiring portions B, C where the tungsten paste 3 is disposed to be electrically taken out through the via-holes 2 of the green sheet 1a. The lead wiring portions B, C have wiring densities (pattern densities) higher than the other portion of the green sheet 1b. The lead wiring portion B has a region B1 where the tungsten paste 3 is not disposed.

The laminated green sheets 1a to 1d shown in FIG. 1A are baked at, for example, 1600° C. in an atmosphere including humidified hydrogen gas to form a multilayered circuit board. As soon as the baking process starts, the tungsten paste 3 starts to shrink with shrinkage forces. The shrinkage forces of the tungsten paste 3 on the lead wiring portions B, C are applied in directions indicated by arrows in FIG. 1B and have magnitudes larger than that on the other portion. On the lead wiring portion B, because the conductive pattern is not disposed on the region B1, the green sheet 1a on the region B1 is pushed up by the shrinkage forces of the tungsten paste 3 in directions opposite to each other indicated by the arrows in FIG. 1B, so that a local warp raising the chip mounting surface A occurs. On the lead wiring portion C, there is no region on which the tungsten paste 3 is not disposed. Therefore, the green sheet 1a is deformed to entirely and gently curve in an opposite direction of the chip mounting surface A.

Figure 1C:
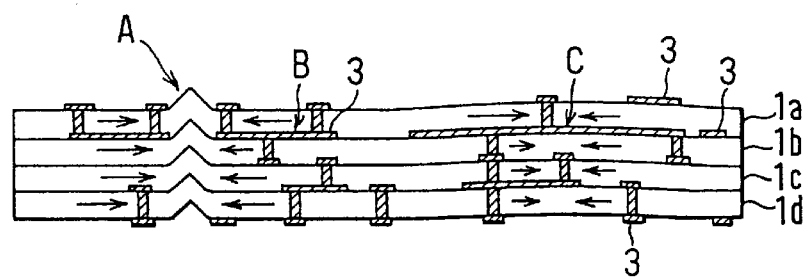
Figure 2:
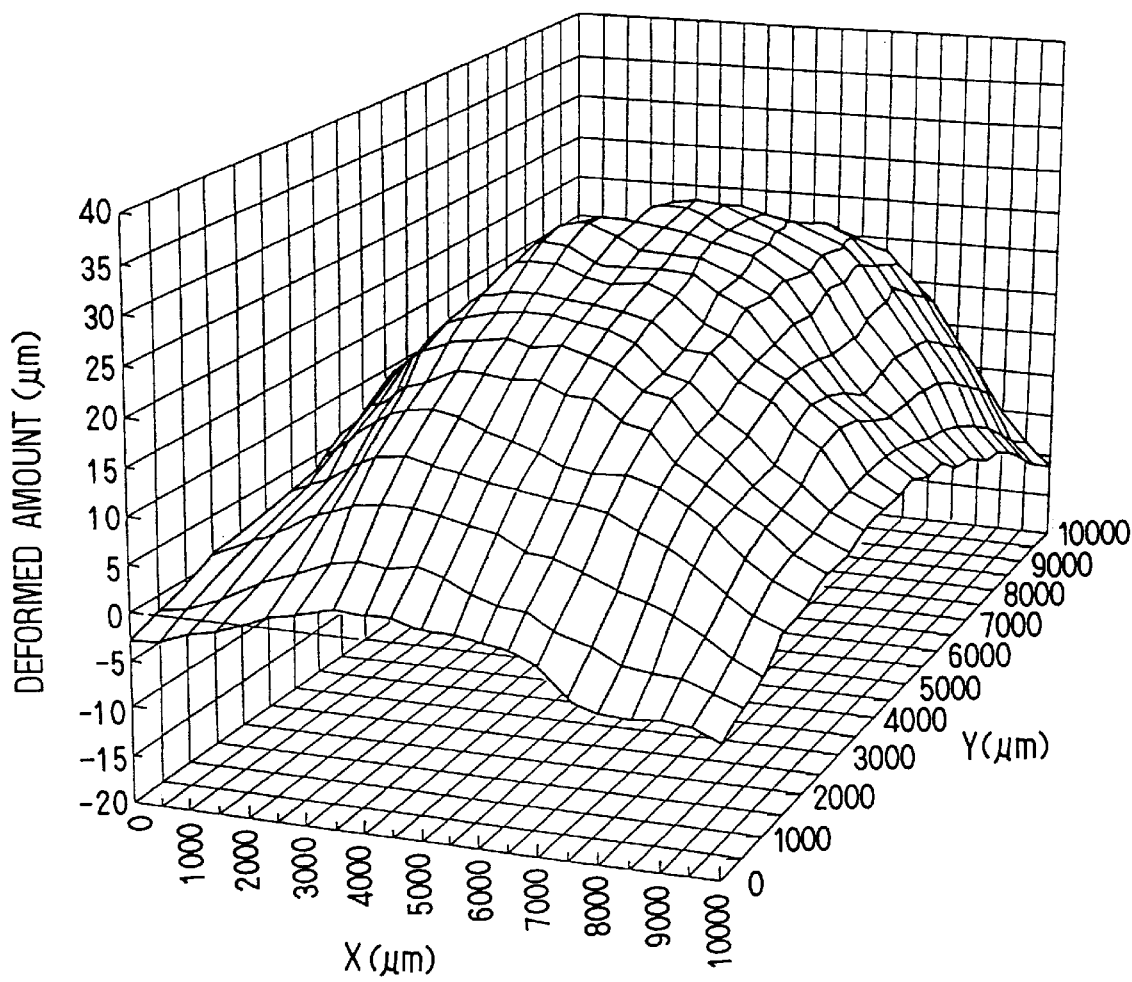
FIG. 2 is a graph showing deformed amounts of the local warp of the multilayer circuit board of FIGS. 1A to 1C.

As the baking process progresses, the green sheets 1a to 1d start to shrink with shrinkage forces indicated with arrows in FIG. 1C. On the other hand, the tungsten paste 3 starts to be hardened. Each of the green sheets 1a to 1d has a shrinkage amount which is controlled by the density of the tungsten paste 3, i.e., by the pattern density thereon. Therefore, the entire laminated green sheets 1a to 1d are complicatedly deformed. The local warp on the lead wiring portion B becomes prominent. On the lead wiring portion C, the green sheets 1a to 1d is deformed to entirely curve in the direction of the chip mounting surface A. A deformed state on the chip mounting surface A of the multilayer circuit board having the same structure shown in FIG. 1C was measured by a laser displacement gauge. The result is shown in FIG. 2. The embodiments of the present invention are realized based on the above-mentioned occurrence mechanism of the local warp.

(First Embodiment)

Figure 3:
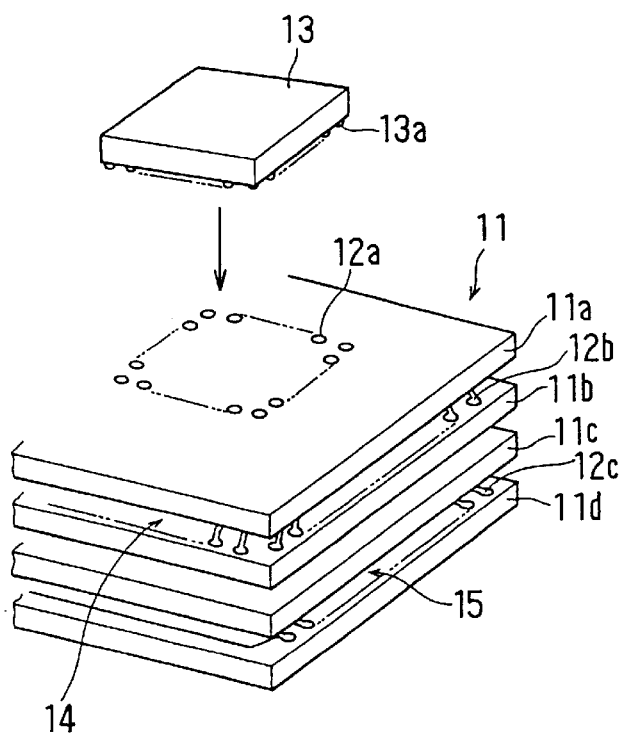
FIG. 3 is an exploded perspective view showing a main portion of a multilayer circuit board and a flip chip which is mounted on the multilayer circuit board in a first preferred embodiment of the present invention.

FIG. 3 shows a multilayer circuit board 11 in a first preferred embodiment of the present invention. The circuit board 11 includes integrated four substrates 11a to 11d which are made of ceramic such as 92% alumina.

The circuit board 11 is manufactured by a green sheet lamination method. Specifically, four green sheets containing alumina powder, mineral powder, an organic binder and the like are prepared. Then, a punching process and a printing process using a conductive paste including tungsten are successively performed on the respective green sheets to form via-holes (not shown) and conductive patterns in and on the green sheets. The via-holes are filled with the conductive paste previous to the printing process. Then, the green sheets are laminated and hot-pressed to be united together. After cutting the united green sheets into a specific shape for the multilayer circuit board 11, the green sheets are heated at a specific temperature, for example, at 1600° C. in an atmosphere including humidified hydrogen gas. Further, one of the conductive patterns exposed on a mounting surface of the multilayer circuit board 11 is covered with a nickel (Ni) plating layer, so that the multilayer circuit board 11 is completed.

Next, arrangements of the conductive patterns of the multilayer circuit board will be described in more detail. Indicated in FIG. 3 is only a part of the conductive patterns.

An upper surface of the first substrate aha serves as the mounting surface of the circuit board 11, on which a flip chip 13 is mounted. Formed on the upper surface of the first substrate 11a are a wiring pattern (not shown) and a plurality of electrode pads 12a corresponding to bump electrodes 13a of the flip chip 13 in number. Although the number of the bump electrodes 13a shown in FIG. 3 is relatively small, the number of the bump electrodes 13a in practical use is more than 100.

Figure 4:
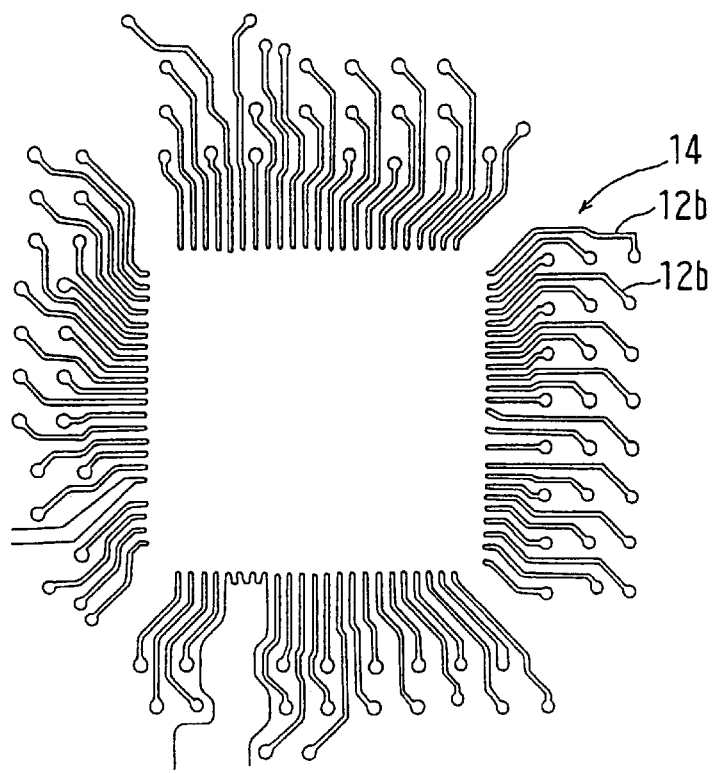
FIG. 4 is a plan view showing a conductive pattern of the multilayer circuit board in the first embodiment.

The second substrate 11b has one of the conductive patterns composed of lead wiring members 12b shown in FIG. 4 and a wiring pattern (not shown) on the upper surface thereof.

The lead wiring members 12b are to be connected to the corresponding bump electrodes 13a of the flip chip 13 through the via-holes in the first substrate 11a and the electrode pads 12a. A pattern density of the conductive pattern of the second substrate 11b is locally high on the region where the lead wiring members 12b are disposed. Herebelow, the region is referred to as a first pattern integrated portion 14.

Figure 5:
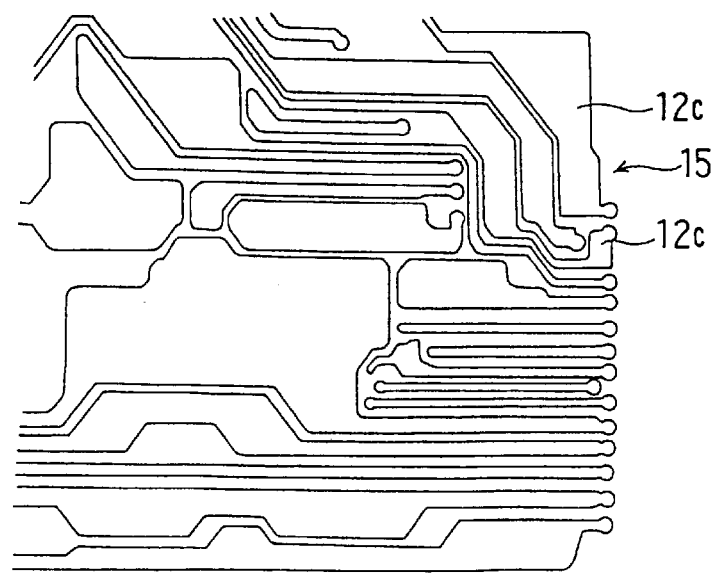
FIG. 5 is a plan view partly showing a conductive pattern of the multilayer circuit board in the first embodiment.

On an upper surface of the third substrate 11c, a wiring pattern (not shown) is formed as one of the conductive patterns as well. Further, on the upper surface of the fourth substrate 11d, a wiring pattern 12c and another wiring pattern (not shown) are formed. The wiring pattern 12c, which is partly shown in FIG. 5, is arranged to have a locally high pattern density on a region corresponding to the first pattern integrated portion 14. This region is referred to as a second pattern integrated portion 15. More specifically, the area of the wiring pattern 12c on the second pattern integrated portion 15 is more enlarged than that necessary for its circuit design to obtain a specific pattern density corresponding to that on the first pattern integrated portion 14. The fourth substrates 11d has the other wiring patterns (not shown) on the lower surface thereof.

That is, in the first embodiment, the second substrate 11b, which is disposed on the upper side of the multilayer circuit board 11 with respect to a center in a laminated direction of the circuit board 11, has the first pattern integrated portion 14 having a high pattern density as compared with the other portion thereof. Further, on the fourth substrate 11d, which is disposed on the lower side of the circuit board 11 with respect to the center in the laminated direction of the circuit board 11, has the second pattern integrated portion 15 having a high pattern density on the region corresponding to the first pattern integrated portion 14 of the second substrate 11b. That is, the first and second pattern integrated portions 14, 15 are symmetrically disposed with respect to the center in the laminated direction of the circuit board 11. In this embodiment, the center in the laminated direction of the circuit board 11 is on a boundary face between the second and third substrates 11b and 11c.

According to the first embodiment, when the laminated substrates 11a to 11d are formed by baking four green sheets to which the conductive paste is applied, shrinkage forces generated on the first pattern integrated portion 14 are approximately equivalent to those generated on the second pattern integrated portion 15. Therefore, forces caused by the shrinkage for locally deforming the circuit board 11 on the first and second pattern integrated portions 14, 15 are cancelled each other. As a result, no local warp is produced on the mounting surface of the circuit board 11.

Figure 6:
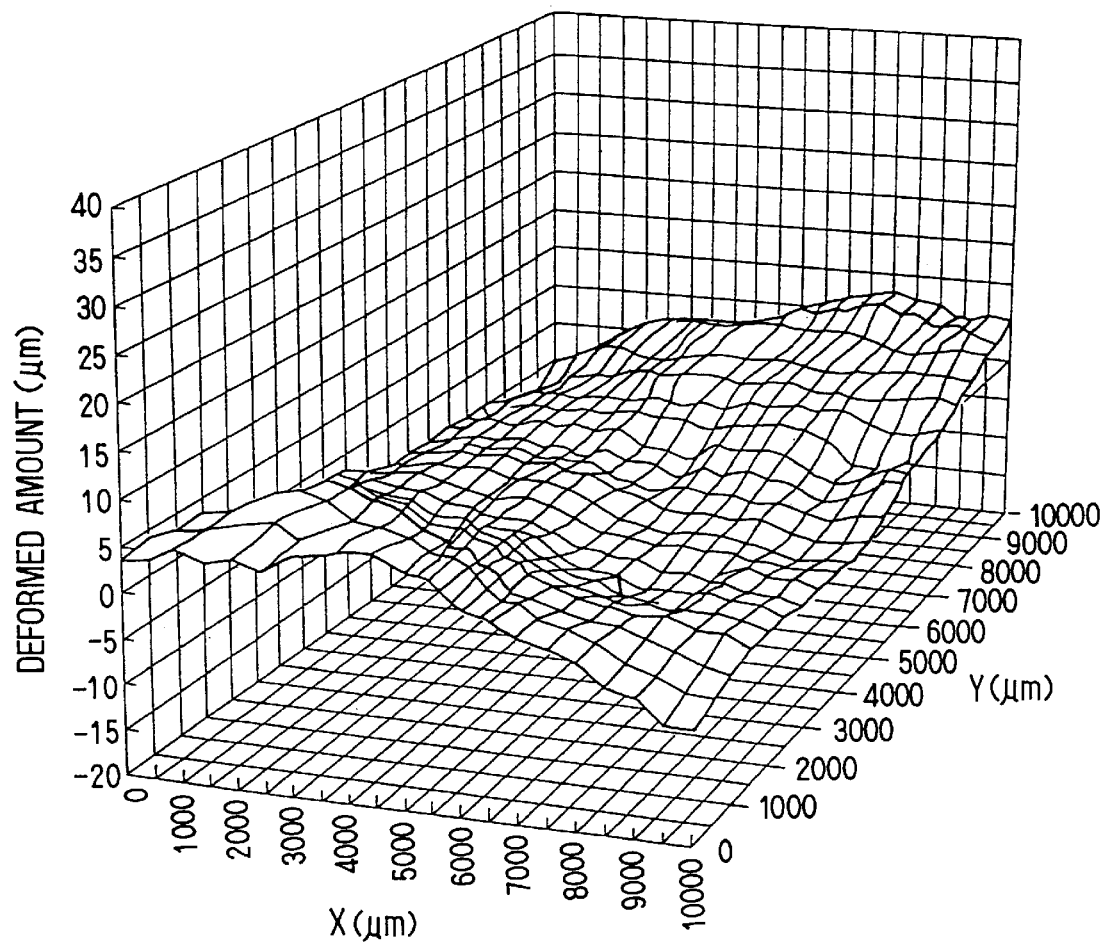
FIG. 6 is a graph showing deformed amounts of the multilayer circuit board in the first embodiment.

A deformed state of the mounting surface of the multilayer circuit board 11 in the first embodiment was measured by the laser displacement gauge. The result is shown in FIG. 6. As understood from FIG. 6, the deformed amounts of the mounting surface of the circuit board 11 are largely decreased as compared with those shown in FIG. 2.

As a result, a solder paste is uniformly coated on the mounting surface of the circuit board 11, resulting in improvement of mounting reliability of the flip chip 3. In addition, because the mounting surface of the circuit board 11 does not have a local warp, a gap between the flip chip 3 and the mounting surface of the circuit board 11 can be uniformly filled with resin material containing inorganic filler without being disturbed by the local warp. This also leads to improvement of the mounting reliability of the flip chip 3. These effects can be obtained only by performing the printing process of the conductive paste on the corresponding one of the green sheets for the second pattern integrated portion 15. That is, the multilayer circuit board 11 in this embodiment can be readily manufactured at low cost.

In the first embodiment, the area of the wiring pattern 12c on the second pattern integrated portion 15 is more enlarged than that necessary for its circuit design. Otherwise, a dummy wiring pattern may be formed on the region other than the wiring pattern 12c. Although the second pattern integrated portion 15 is only formed on the upper surface of the fourth substrate 11d, the second pattern integrated portion 15 may be dispersively formed on several surfaces. It is not always necessary that the second pattern integrated portion 15 is formed only on one substrate, provided that shrinkage forces caused by the first pattern integrated portion 14 are canceled by the shrinkage forces caused by the second pattern integrated portion 15, and vice versa. In the first embodiment, although only the fourth substrate 11d has the conductive pattern on the lower surface thereof, it is apparent that the lower surfaces of the first to third substrates 11a, 11b, 11c can have conductive patterns thereon.

(Second Embodiment)

Figure 7:
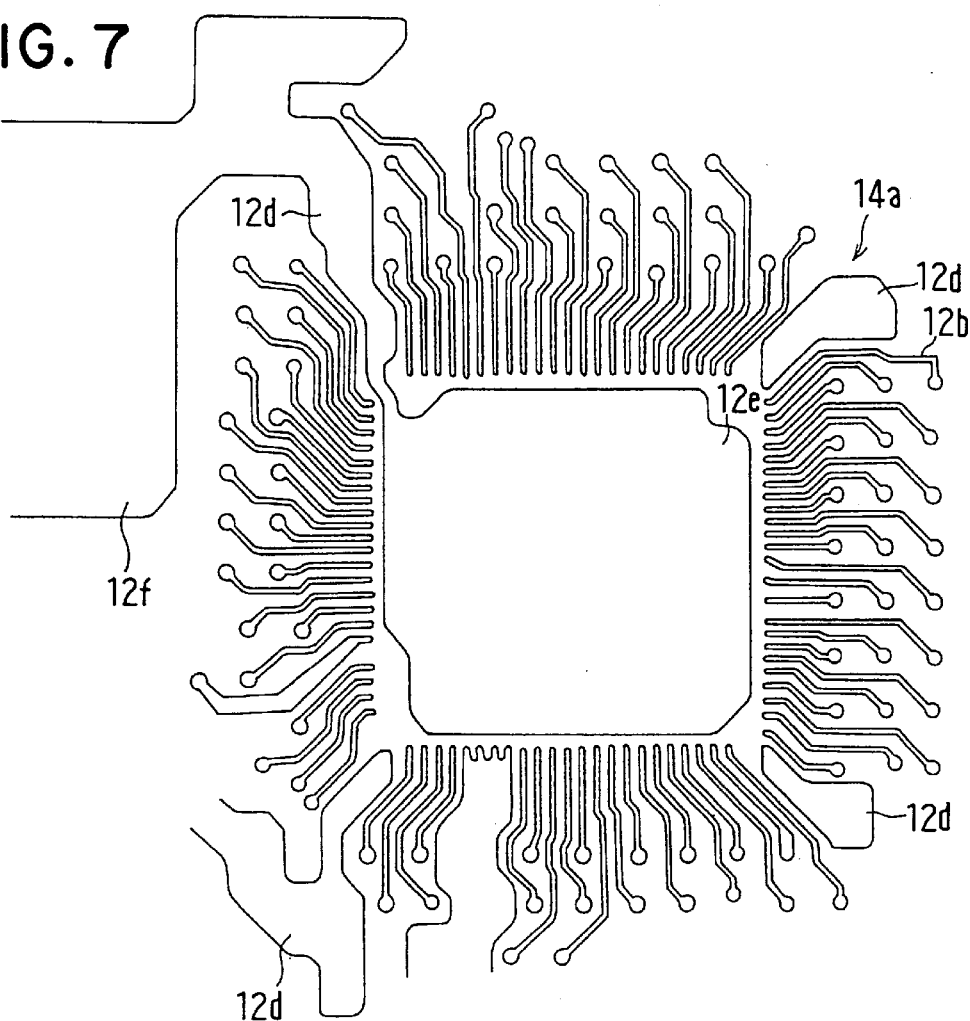
FIG. 7 is a plan view showing a conductive pattern of a multilayer circuit board in a second preferred embodiment.

In a second preferred embodiment of the present invention, the second substrate 11b has a pattern integrated portion 14a shown in FIG. 7 instead of the first pattern integrated portion 14 in the first embodiment. The pattern integrated portion 14a has dummy electrodes 12d, 12e, 12f on regions where the lead wiring members 12b are not disposed such that a pattern density in the vicinity of and on the lead wiring members 12b becomes approximately constant. Specifically, the dummy electrodes 12d are arranged on regions adjacent to the lead wiring members 12b, the dummy electrode 12e is arranged at a center of the lead wiring members 12b, and the dummy electrode 12f is arranged outside of the lead wiring members 12b to be connected with the dummy electrode 12e through one of the dummy electrodes 12d. In the second embodiment, it is not necessary to intentionally form the second pattern integrated portion 15 as in the first embodiment. The other features are the same as those in the first embodiment.

According to the second embodiment, the pattern density on the pattern integrated portion 14a is approximately constant, so that a local warp produced due to a region having a low pattern density can be prevented. In the second embodiment, although the dummy electrodes 12d are employed to uniform the pattern density, the area of the lead wiring members 12b may be enlarged to uniform the pattern density.

(Third Embodiment)

Figure 8:
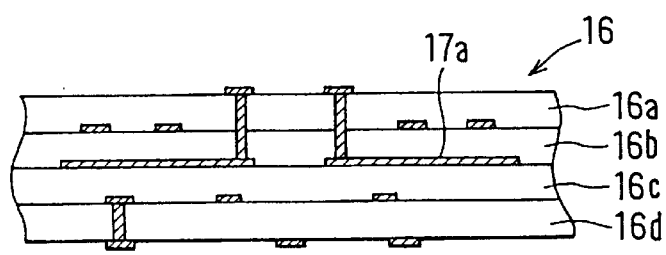
FIG. 8 is a cross-sectional view partly showing a multilayer circuit board in a third preferred embodiment.

FIG. 8 shows a multilayer circuit board 16 in a third preferred embodiment of the present invention. The circuit board 16 includes integrated four substrates 16a to 16d, which are made of ceramic such as alumina of 92%. The circuit board 16 is manufactured substantially in the same manner as in the first embodiment except that a plurality of lead wiring members 17a, which are to be connected to the bump electrodes 13a of the flip chip 13, are formed on the upper surface of the third substrate 16c. The upper surface of the third substrate 16c approximately corresponds to a center surface in a laminated direction of the circuit board 16.

That is, the lead wiring members 17a having a high pattern density are disposed on the center surface in the laminated direction of the circuit board 16. Therefore, when the laminated green sheets for the first to fourth substrates 16a to 16d are baked, distortions on upper and lower sides of the circuit board 16 caused by the lead wiring members 17a can be cancelled each other. Here, it should be noted that thicknesses on the lower and upper sides of the circuit board 16 with respect to the center surface thereof are approximately equal to each other. As a result, no local warp is produced on the mounting surface of the circuit printed board 16.

(Fourth Embodiment)

Figure 9:
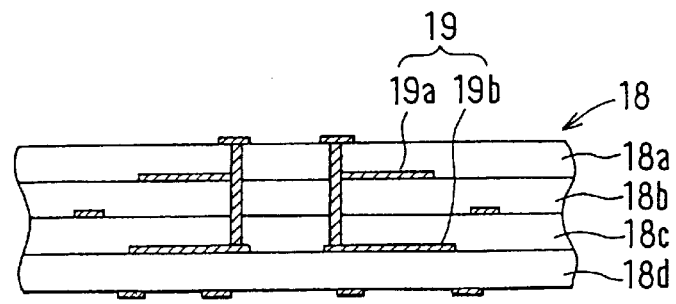
FIG. 9 is a cross-sectional view partly showing a multilayer circuit board in a fourth preferred embodiment.
Figure 10A:
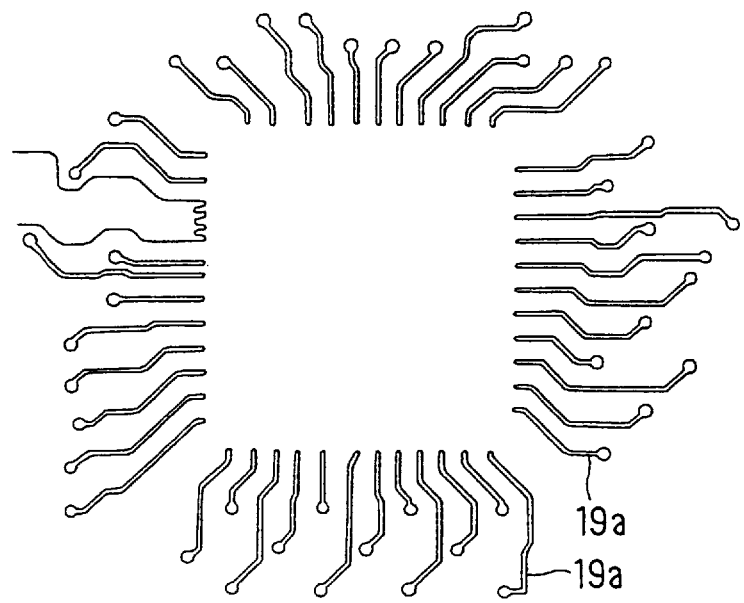
FIGS. 10A and 10B are plan views showing conductive patterns of the multilayer circuit board in the fourth embodiment.
Figure 10B:
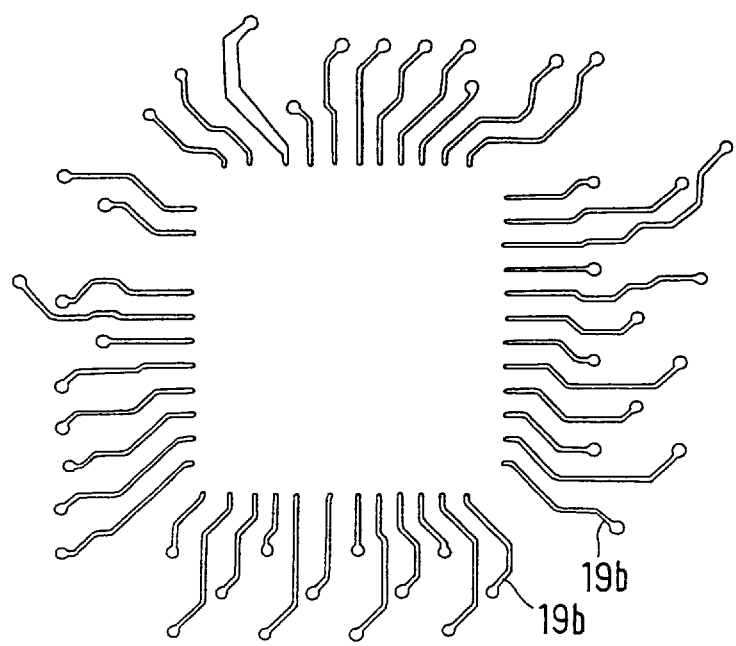

FIG. 9 shows a multilayer circuit board 18 in a fourth preferred embodiment of the present invention. The multilayer circuit board 18 includes integrate four substrates 18a to 18d, which are made of ceramic such as 92% alumina. The circuit board 18 is manufactured in substantially the same manner as in the first embodiment except that lead wiring members 19 which are to be connected to the bump electrodes 13a of the flip chip 13 are dispersively arranged on several substrates. That is, in the fourth embodiment, the lead wiring members 19 are composed of first lead wiring members 19a formed on the upper surface of the second substrate 18b and second lead wiring members 19b formed on the upper surface of the fourth substrate 18d. FIGS. 10A and 10B respectively show arrangements of the first and second lead wiring members 19a, 19b. In the fourth embodiment, it is not necessary to intentionally form the second pattern integrated portion 15 as in the first embodiment.

In the fourth embodiment, the lead wiring members 19 are dispersively formed on the second and fourth substrates 18b, 18d, so that the pattern densities on the second and fourth substrates 18b, 18d are averaged. Therefore, the distortion caused by the shrinkages of the conductive paste and of the green sheets contacting the conductive paste for the lead wiring members 19 can be dispersed on the four substrates. As a result, a deformed amount of the circuit board 18 is reduced to prevent a local warp on the mounting surface of the circuit board 18.

While the present invention has been shown and described with reference to the foregoing preferred embodiments, it will be apparent to those skilled in the art that changes in form and detail may be made therein without departing from the scope of the invention as defined in the appended claims.

For example, although the multilayer circuit board is composed of four substrates in the above-mentioned embodiments, it can be composed of three or more than four substrates. It is apparent that the multilayer circuit board can hold thereon the other surface mounted type elements, for example, LSIs retained in packages such as BGA, in addition to the flip chip. Although the multilayer circuit board is made of 92% alumina in the above-mentioned embodiments, the content of alumina can be changed. Further, the circuit board may be made of the other ceramic materials or glass-ceramic materials such as alumina system magnetic materials or beryllia system magnetic materials. As the conductive paste, the other pastes such as a molybdenum paste, a silver paste, and a copper paste can be used in addition to the tungsten paste.

Variations such as those described above are to be understood as being within the scope of the present invention as defined by the appended claims.

What is claimed is:

1. A multilayer circuit board comprising:
    a first group having a plurality of substrates having a main surface thereon;
    a second group having a plurality of substrates stacked with the first group on an opposite side of the main surface of the first group;
    a plurality of surface electrodes disposed at a mounting region of the main surface of the first group, the mounting region being for mounting an electronic part thereon;
    a first pattern integrated portion provided on a surface of one of the plurality of substrates of the first group, the first pattern integrated portion being disposed around a specific region of the surface of the first group, the specific region covering an area on the surface which corresponds to the mounting region on the mounting surface, said first pattern integrated portion including a plurality of wiring members electrically connected to the plurality of surface electrodes and extending from the specific region; and
    a wiring material printed portion provided on an area of a surface of one of the plurality of substrates of the second group, the area of the surface corresponding to an area covered by the first pattern integrated portion of the surface of the first group.

2. The multilayer circuit board of claim 1, wherein the first pattern integrated portion and the wiring material printed portion are symmetrical with respect to a center in the thickness direction of the laminated substrates.

3. The multilayer circuit board of claim 1, wherein the wiring material printed portion includes a wiring member extending under the mounting region of the main surface and having an inconstant width.

4. The multilayer circuit board of claim 1, wherein the wiring material printed portion includes a plurality of lower side wiring members to constitute a second pattern integrated portion.

5. The multilayer circuit board of claim 1, wherein the wiring material printed portion includes a plurality of dummy wiring members, the plurality of dummy wiring members being electrically free.

6. The multilayer circuit board of claim 1, wherein one of the plurality of substrates of the first group and the plurality of substrates of the second group has a wiring material portion having a specific area at a region which corresponds to the mounting region of the main surface.

7. The multilayer circuit board of claim 6, wherein the wiring material portion is disposed on the same surface as that of the plurality of wiring members, and is surrounded by the plurality of wiring members.

8. The multilayer circuit board of claim 6, wherein the wiring material portion is disposed on the same surface as that of the plurality of wiring members, and has a part disposed between adjacent two of the plurality of wiring members, thereby controlling a pattern density of the first pattern integrated portion.

9. The multilayer circuit board of claim 1, wherein:
    the wiring members of the first pattern integrated portion are upper side wiring members which are electrically connected to a first group of the plurality of surface electrodes; and
    the wiring material printed portion includes a plurality of lower side wiring members which are electrically connected to a second group of the plurality of surface electrodes.

10. A multilayer circuit board comprising:
    a plurality of laminated substrates having a main surface;
    a plurality of surface electrodes disposed at a mounting region of the main surface, the mounting region being for mounting an electronic part;
    a pattern integrated portion provided on one of the plurality of laminated substrates and including a plurality of wiring members, the plurality of wiring members being electrically connected to the plurality of surface electrodes and disposed around a region of the surface, the region of the surface corresponding to the mounting region of the main surface, the pattern integrated portion including a wiring material portion provided on the region of the surface.

11. The multilayer circuit board of claim 10, wherein the wiring material portion is surrounded by the plurality of wiring members.

12. The multilayer circuit board of claim 10, wherein the wiring material portion includes a part existing between adjacent two of the plurality of wiring members.

13. The multilayer circuit board of claim 10, further comprising a wiring material printed portion provided on a surface of another one of the plurality of laminated substrates and disposed under the pattern integrated portion and the wiring material portion.

* * * * *